US012574000B2

(12) United States Patent (10) Patent No.: US 12,574,000 B2
Datta et al. (45) Date of Patent: Mar. 10, 2026

(54) BALUN TRANSFORMER CIRCUIT FOR REDUCTION OF AN IMPEDANCE OF A DIFFERENTIAL POWER AMPLIFIER LOAD LINE

(71) Applicant: Skyworks Solutions, Inc., Irvine, CA (US)

(72) Inventors: Kunal Datta, Sunnyvale, CA (US); Shihan Qin, Fresno, CA (US); Srivatsan Jayaraman, Santa Clara, CA (US)

(73) Assignee: Skyworks Solutions, Inc., Irvine, CA (US)

( * ) Notice: Subject to any disclaimer, the term of this patent is extended or adjusted under 35 U.S.C. 154(b) by 339 days.

(21) Appl. No.: 18/208,187

(22) Filed: Jun. 9, 2023

(65) Prior Publication Data

US 2023/0402988 A1     Dec. 14, 2023

Related U.S. Application Data

(60) Provisional application No. 63/351,036, filed on Jun. 10, 2022.

(51) Int. Cl.
| | |
|---|---|
| *H03H 7/42* | (2006.01) |
| *H02M 3/157* | (2006.01) |
| *H03F 3/45* | (2006.01) |
| *H03H 7/01* | (2006.01) |
| *H03H 7/38* | (2006.01) |

(52) U.S. Cl.
CPC .............. *H03H 7/42* (2013.01); *H02M 3/157* (2013.01); *H03F 3/45* (2013.01); *H03H 7/0115* (2013.01); *H03H 7/38* (2013.01)

(58) Field of Classification Search
CPC ........... H03H 7/42; H03H 7/422; H03H 7/425
USPC .................................. 333/4, 5, 125, 177, 185
See application file for complete search history.

(56) References Cited

U.S. PATENT DOCUMENTS

| | | | |
|---|---|---|---|
| 6,057,714 | A | 5/2000 | Andrys et al. |
| 6,466,770 | B1 | 10/2002 | Griffith et al. |
| 6,853,526 | B1 | 2/2005 | Van Saders et al. |
| 6,871,059 | B1 | 3/2005 | Piro et al. |
| 8,264,297 | B2 | 9/2012 | Thompson |
| 9,450,541 | B2 | 9/2016 | Beltran et al. |
| 9,450,639 | B2 | 9/2016 | Zhang et al. |
| 9,467,115 | B2 | 10/2016 | Lyalin et al. |
| 9,800,207 | B2 | 10/2017 | Datta et al. |
| 9,806,676 | B2 | 10/2017 | Balteanu et al. |
| 9,866,196 | B2 | 1/2018 | Gorbachov |
| 9,912,299 | B2 | 3/2018 | Lyalin et al. |
| 10,044,400 | B2 | 8/2018 | Zhang et al. |
| 10,110,184 | B2 | 10/2018 | Lyalin et al. |
| 10,340,861 | B2 | 7/2019 | Ye et al. |
| 10,355,647 | B2 | 7/2019 | Datta et al. |
| 10,411,662 | B2 | 9/2019 | Lyalin et al. |
| 10,536,187 | B2 | 1/2020 | Zhang et al. |
| 10,566,946 | B2 | 2/2020 | Gorbachov |
| 10,637,412 | B2 | 4/2020 | Ye et al. |

(Continued)

*Primary Examiner* — Rakesh B Patel

(74) *Attorney, Agent, or Firm* — Knobbe, Martens, Olson & Bear, LLP

(57) ABSTRACT

Apparatus and methods for balun transformer circuits within electronic devices are provided. In certain embodiments, balun transformer circuits are used for reduction of an impedance of a differential load line of a differential power amplifier.

20 Claims, 7 Drawing Sheets

(56)                    References Cited

U.S. PATENT DOCUMENTS

| | | | |
|---|---|---|---|
| 10,944,367 B2 | 3/2021 | Lyalin et al. | |
| 11,283,416 B2 | 3/2022 | Cao et al. | |
| 11,595,008 B2 | 2/2023 | Jain et al. | |
| 11,616,485 B2 | 3/2023 | Azizi | |
| 11,626,855 B2 | 4/2023 | Azizi | |
| 11,652,453 B2 | 5/2023 | Lee et al. | |
| 11,671,061 B2 | 6/2023 | Gebeyehu et al. | |
| 11,855,328 B2 | 12/2023 | Pehlke | |
| 11,923,808 B2 | 3/2024 | Jain et al. | |
| 2008/0101263 A1 | 5/2008 | Barber et al. | |
| 2010/0062813 A1 | 3/2010 | Kujanski et al. | |
| 2012/0075019 A1* | 3/2012 | Visser | H03F 3/195 |
| | | | 330/196 |
| 2013/0040589 A1* | 2/2013 | Liu | H04B 1/006 |
| | | | 455/120 |
| 2018/0159478 A1 | 6/2018 | Balteanu et al. | |
| 2020/0136670 A1 | 4/2020 | Zhang et al. | |
| 2020/0295708 A1* | 9/2020 | Khlat | H03F 3/602 |
| 2022/0140498 A1 | 5/2022 | Naraine et al. | |
| 2022/0140499 A1 | 5/2022 | Naraine et al. | |
| 2022/0190803 A1 | 6/2022 | Azizi et al. | |
| 2022/0376662 A1 | 11/2022 | Datta et al. | |
| 2022/0376733 A1 | 11/2022 | Datta et al. | |
| 2022/0385331 A1 | 12/2022 | Balteanu et al. | |
| 2022/0393654 A1 | 12/2022 | Li et al. | |
| 2023/0020495 A1 | 1/2023 | Lehtola et al. | |
| 2023/0024830 A1 | 1/2023 | Datta et al. | |
| 2023/0095653 A1 | 3/2023 | Jain et al. | |
| 2023/0104305 A1 | 4/2023 | Lyalin et al. | |
| 2023/0105489 A1 | 4/2023 | Lyalin et al. | |
| 2023/0107913 A1 | 4/2023 | Pehlke | |
| 2023/0275548 A1 | 8/2023 | Lee et al. | |
| 2023/0291378 A1 | 9/2023 | Azizi | |
| 2023/0327615 A1 | 10/2023 | Chen et al. | |
| 2023/0344395 A1 | 10/2023 | Nuzum et al. | |
| 2023/0361724 A1 | 11/2023 | Chen et al. | |
| 2023/0402988 A1 | 12/2023 | Datta et al. | |
| 2024/0030578 A1 | 1/2024 | Pehlke | |
| 2024/0072755 A1 | 2/2024 | Yu et al. | |
| 2024/0079998 A1 | 3/2024 | Drogi et al. | |
| 2024/0171128 A1 | 5/2024 | Jain et al. | |
| 2025/0070733 A1* | 2/2025 | Cao | H03F 3/26 |

* cited by examiner

MOBILE DEVICE 800

FRONT END 803

ANTENNA TUNING 810

PAs 811

LNAs 812

FILTERS 813

SWITCHES 814

SPLITTING/COMBINING 815

804

TRANSCEIVER 802

BASEBAND 801

POWER MANAGEMENT 805

USER INTERFACE 807

MEMORY 806

BATTERY 808

BALUN TRANSFORMER CIRCUIT FOR REDUCTION OF AN IMPEDANCE OF A DIFFERENTIAL POWER AMPLIFIER LOAD LINE

CROSS-REFERENCE TO RELATED APPLICATIONS

Any and all applications for which a foreign or domestic priority claim is identified in the Application Data Sheet as filed with the present application are hereby incorporated by reference under 37 CFR 1.57.

TECHNICAL FIELD

Various aspects of this disclosure relate to circuits for power amplifiers, including those used in radio frequency electronics.

BACKGROUND

Radio frequency (RF) communication systems can be used for transmitting and/or receiving signals of a wide range of frequencies. For example, an RF communication system can be used to wirelessly communicate RF signals in a frequency range of about 30 kHz to 300 GHz, such as in the range of about 400 MHz to about 7.125 GHz for Frequency Range 1 (FR1) of the Fifth Generation (5G) communication standard or in the range of about 24.250 GHz to about 71.000 GHz for Frequency Range 2 (FR2) of the 5G communication standard.

Examples of RF communication systems include, but are not limited to, mobile phones, tablets, base stations, network access points, customer-premises equipment (CPE), laptops, and wearable electronics.

Power amplifiers used in RF communication systems can provide amplified signals to a load. In many applications, power amplifiers need to support high power levels for output signals supplied to the load connected to a differential output of the power amplifier. Conventional power amplifier modules use a boost DC-DC converter to fulfill the power specifications. The boost DC-DC converter can boost an available supply voltage to a boosted voltage and thus enables the power amplifier module to generate higher power levels. However, the incorporation of a boost DC-DC converter may increase complexity and space.

SUMMARY

In accordance with aspects of the present disclosure, a balun transformer circuit is disclosed for reduction of an impedance of a differential load line of a differential power amplifier.

In accordance with an aspect of the present disclosure there is provided a balun transformer circuit. The balun transformer circuit is capable of providing high power supply levels for a load without the inclusion of a boost DC-DC converter.

The balun transformer circuit for reduction of an impedance of a differential load line of differential power amplifier includes a primary coil connected at an input side of the balun transformer circuit to a differential output of the differential power amplifier integrated in a power amplifier chip package via conductor elements, a secondary coil coupled to the primary coil and connected at an output side of the balun transformer circuit to an electrical load receiving electrical power from the differential output of the differential power amplifier through said balun transformer circuit, and at least one transforming capacitor provided at the input side of the balun transformer circuit. The transforming capacitor has a capacitance adapted to transform a parasitic inductance of the conductor elements and a leakage inductance of the balun transformer circuit into a differential T-network impedance transformer element adapted to reduce the impedance of the differential load.

In some embodiments, the at least one transforming capacitor is connected as a shunt RF capacitor in parallel to the primary coil of the balun transformer circuit.

In various embodiments, the capacitance of the transforming capacitor is tunable.

According to several embodiments, the transforming capacitor comprises a surface mounted device component.

In line with a number of embodiments, the differential power amplifier comprises an in built low voltage DC-DC buck converter.

According to some embodiments, the conductor elements comprise wire bonds. In various embodiments, the conductor elements comprise flip-chip bumps.

In a number of embodiments, the electrical load connected to the secondary coil of the balun transformer circuit comprises an antenna.

In some embodiments, a further RF capacitor is connected in parallel to each conductor element of the differential output of the differential power amplifier to compensate at least partially the leakage inductance of the balun transformer circuit.

In various embodiments, the balun transformer circuit further includes an RF bridge capacitor forming a bridging component between two serially connected primary coil portions of the primary coil of the balun transformer circuit to compensate at least partially the leakage inductance of the balun transformer circuit.

According to a number of embodiments, the balun transformer circuit further includes bypass capacitors arranged on both sides of the RF bridge capacitor.

In some embodiments, the balun transformer circuit comprises a laminated balun transformer circuit.

In accordance with a further aspect of the present disclosure, a power amplifier module is provided. The power amplifier module comprises a differential power amplifier having a differential output connected to a balun transformer circuit for reduction of an impedance of a load line of a differential power amplifier. The balun transformer circuit includes a primary coil connected at an input side of the balun transformer circuit to the differential output of the differential power amplifier integrated in a power amplifier chip package via conductor elements, a secondary coil coupled to the primary coil and connected at an output side of the balun transformer circuit to an electrical load receiving electrical power from the differential output of the differential power amplifier through said balun transformer circuit, and at least one transforming capacitor provided at the input side of the balun transformer circuit. The transforming capacitor has a capacitance adapted to transform a parasitic inductance of the conductor elements and a leakage inductance of the balun transformer circuit into a differential T-network impedance transformer element adapted to reduce the impedance of the load line.

In various embodiments, the differential power amplifier comprises a push-pull power amplifier.

According to a number of embodiments, the differential power amplifier is a 5G power amplifier providing a Power Cluster 2 (PC2) power level of electrical power supplied via the balun transformer circuit to an electrical load connected to the output side of the balun transformer circuit.

BRIEF DESCRIPTION OF THE DRAWINGS

Embodiments of the disclosure will be described, by way of non-limiting examples, with reference to the accompanying drawings. Components in the drawings are not necessarily drawn to scale. Moreover, in the drawings like reference numerals designate corresponding parts in different views.

DETAILED DESCRIPTION OF CERTAIN EMBODIMENTS

Figure 1:
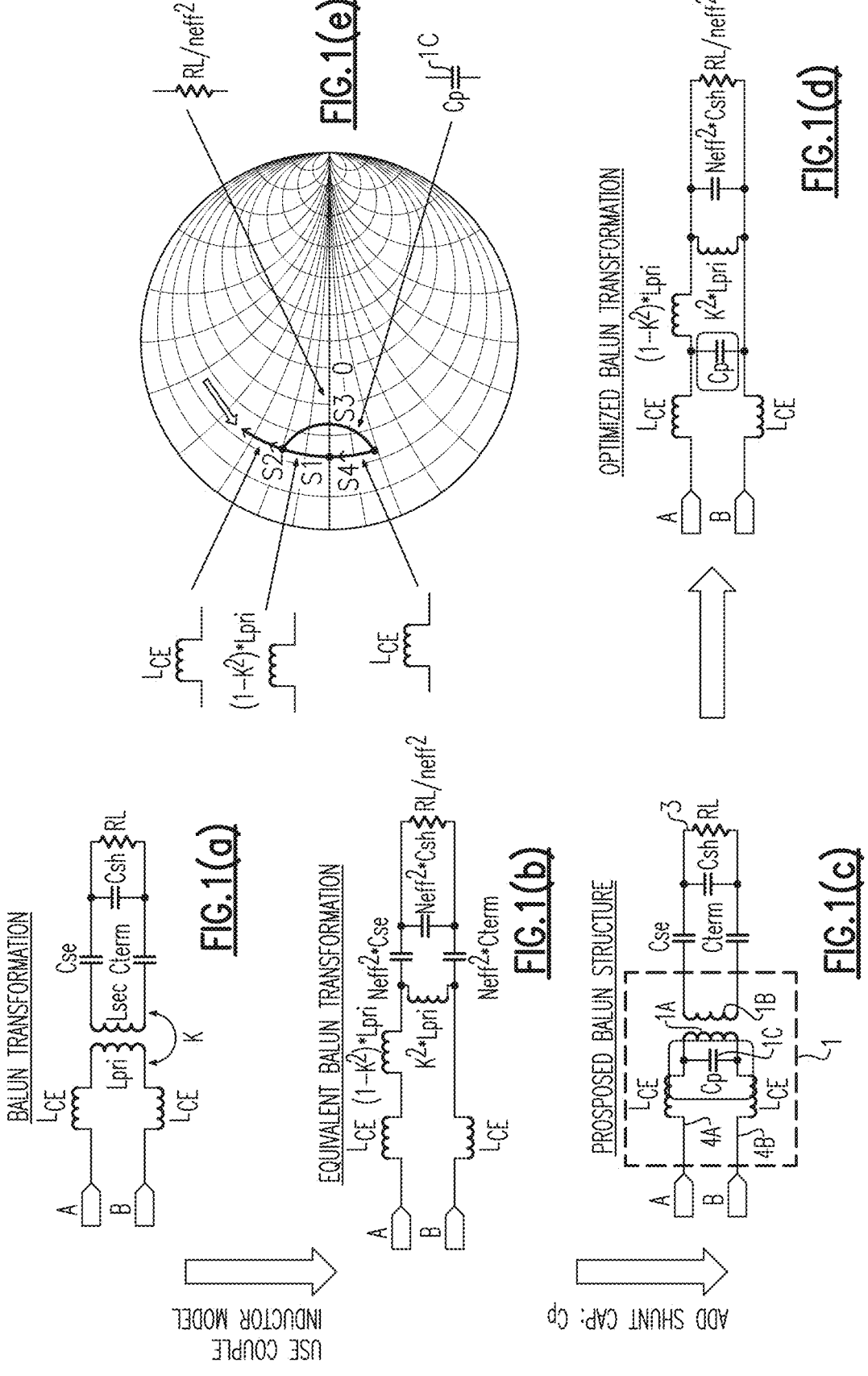
FIGS. 1a to 1e illustrate an impedance transformation to implement a balun transformer circuit according to some embodiments of the present disclosure.

Certain embodiments relate generally to balun transformer circuits within electronic devices and in particular to embodiments of balun transformer circuits used for reduction of an impedance of a differential load line of a differential power amplifier.

The following detailed description of certain embodiments presents various description of specific embodiments. However, innovations described herein can be embodied in multiple different ways, for example as defined and covered by the claims. With this description, reference is made to the figures where like reference numerals can indicate identical or functionally similar elements. It will be understood that elements illustrated in the figures are not necessarily drawn to scale. Moreover, it will be understood that certain embodiments can include more elements than illustrated in the figure and/or a subset of elements illustrated in the respective figure. Further, some embodiments can incorporate any suitable combination of features from different figures.

FIGS. 1a to 1e illustrate a process of impedance transformation to implement an optimized circuit forming a possible embodiment of a balun transformer circuit 1 according to the first aspect of the present disclosure.

The balun transformer circuit 1 may be used to convert a balanced signal on a balanced transmission line into an unbalanced signal on an unbalanced transmission line or to convert an unbalanced signal on an unbalanced transmission line into a balanced signal on a balanced transmission line. The balun transformer circuit 1 as illustrated in FIG. 1a can be connected at its input side to a differential output A, B of a differential power amplifier 2. The balun transformer circuit 1 as illustrated in FIG. 1a is connected at its output side to an electrical load 3 such as an antenna having a load resistance $R_L$. With reference to FIG. 1a, the balun transformer circuit 1 comprises a primary coil 1A coupled to a secondary coil 1B with a coupling factor K.

The primary coil 1A at the input side of the balun transformer circuit 1 is connected to a differential output of the differential power amplifier 2 incorporated in a power amplifier chip package via conductor elements 4A, 4B. In some implementations, these conductor elements 4A, 4B may be so-called flip-chip bumps. Flip-chip bumps are used in a chip packaging technique in which an active area of a chip is flipped over facing downward. Instead of facing up and bonded to the package leads with wires from the outside edges of the chip, flip-chip bumps allow any surface area of the flipped chip to be used for interconnection. This is typically done through metal bumps made of solder, copper or nickel/gold. These bumps or balls can be soldered onto the package substrate or the circuit board itself and can then be underfilled, for example with epoxy. The use of flip-chip bumps allows for a larger number of interconnections with shorter distances to be made than using conventional wires. Moreover by using flip-chip bumps unwanted parasitic inductances may be reduced.

Further, in an alternative embodiment the primary coil 1A at the input side of the balun transformer circuit 1 can be connected via wire bonds to the output of the differential power amplifier 2 integrated in the power amplifier chip package.

The conductor elements 4A, 4B, i.e. the wire bonds or the flip-chip bumps, have an inductance $L_{CE}$ as illustrated in the circuit diagram of FIG. 1a. On the output side the secondary coil 1B of the balun transformer circuit 1 is coupled to an electrical load 3 having a resistance $R_L$. FIG. 1a illustrates also the serial capacitance $C_{SE}$ and a termination capacitance $C_{term}$ as well as a shunt capacitance $C_{sh}$ connected in parallel to the electrical load 3 having a resistance value of $R_L$.

Using a coupled inductor model the circuit diagram as illustrated in FIG. 1a can be transformed into an equivalent balun transformer circuit 1 as illustrated in FIG. 1b. Technically realizable balun transformer circuits have a coupling factor K between the primary coil 1A and the secondary coil 1B of the balun transformer circuit 1 which is less than 1 (K<1). This leads to generation of a leakage inductance which can be modelled as a standalone inductor on the load line side of the balun transformer circuit 1 as shown in FIG. 1b.

FIG. 1e shows a Smith chart to illustrate the process of arriving to an optimized balun transformer circuit as illustrated in the circuit diagram of FIG. 1c having an equivalent circuit as illustrated in FIG. 1d. A Smith chart as illustrated in FIG. 1d is a well-known tool providing a graphical representation and interpretation of parameters of a circuit. The Smith chart uses a bilinear Moebius transformation projects a complex impedance plane onto a complex gamma plane.

$$gamma=(Z-Z0)/(Z+Z0) \text{ with impedance } Z=R+jX$$

Accordingly, a half plane with positive real part of impedance Z is mapped onto an interior of a unit circle of the so-called gamma plane as shown in FIG. 1e. As can be seen in FIG. 1e, in a first stage S1 the presence of the leakage inductance $(1-K^2) L_{PRI}$ causes the impedance Z presented by the balun transformer circuit 1 to move up in the inductive plane as shown in FIG. 1e. The added leakage inductance leads to a clockwise movement in the plane shown in FIG. 1e.

Further, the power amplifier chip package of the power amplifier 2 is connected to the input side of the balun transformer circuit 1 through conductor elements 4A, 4B. Conductor elements 4A, 4B can comprise either wire bonds or flip-chip bumps. In both cases the conductor elements 4A, 4B have an inductance $L_{CE}$ which is added to the balun leakage conductance in series. In a second stage S2, this further pushes the balun load line up in the inductive plane of the Smith chart as illustrated in FIG. 1e. Accordingly, both parasitic inductances, i.e. the leakage inductance and the inductance $L_{CE}$ of the conductor elements 4A, 4B, upconvert the real impedance presented by the balun transformer circuit 1 and result in a higher equivalent parallel impedance as seen by the power amplifier 2.

A transforming capacitor 1C with a capacitance value $C_p$ is added within the balun transformer circuit 1 between the two sides of the primary arm of the balun transformer circuit 1 as illustrated in FIG. 1c. This transforming capacitor 1C aids in reducing the impedance of the differential load line of the differential power amplifier 2 and allows realizing low load lines for different frequencies. As can be seen in FIG. 1c, the transforming capacitor 1C is connected in parallel to the primary coil 1A with an inductance value of $L_{PRI}$ of the balun transformer circuit 1. As illustrated in the equivalent circuit diagram of FIG. 1d, the transforming capacitor 1C forms a T-network impedance transformer element along with the balun leakage inductance and the inductance $L_{CE}$ provided by the conductor elements 4A, 4B.

As can be seen in the Smith chart illustrated in FIG. 1e, in a third stage S3 the transforming capacitor 1C rotates the impedance set due to the leakage inductance into the capacitive part of the Smith chart. The impedance further gets back to the low impedance real plane due to the parasitic inductance $L_{CE}$ of the conductor elements 4A, 4B. This approach utilizes two parasitic inductors to form another differential T-network impedance transformer.

By choosing an appropriate value for the capacitance $C_p$ of the transforming capacitor 1C taking into account the parasitic leakage inductance of the balun transformer circuit 1 itself and the parasitic inductance $L_{CE}$ of the conductor elements 4A, 4B it is possible to provide a balun transformer circuit 1 differential impedance having about 5 to 6 Ohms, i.e. 3 Ohms single ended impedance on each side of the balun transformer circuit 1. This can enable PC2 output power levels derived from a 3.4 Volts supply.

5G power amplifier modules disclosed herein can be configured to support high PC2 power levels according to 3GPP specifications for an enhanced range of operation when transmitting 5G-NR transmission frequencies for instance in the frequency range between 2.3 GHz to 5 GHz. These PC2 power levels at the power amplifier module output can range from 28.5 dBm to 30 dBm, depending on the use case. Conventional power amplifier modules may support such high power specifications by using a boost DC-DC converter, using a standard battery voltage of e.g. 3.8 V is boosted to a voltage of 5 V at the power amplifier supply mode.

By using the balun transformer circuit 1 according to the first aspect of the present disclosure as illustrated in the circuit diagram of FIG. 1c, power amplifier modules can forego the incorporation of a boost DC-DC converter while still achieving acceptable power and performance. Accordingly, power amplifier modules according to embodiments described herein incorporating the balun transformer circuit 1 of FIG. 1c do not integrate a boost DC-DC converter within the power amplifier module, while achieving acceptable power and performance.

The balun transformer circuit 1 as illustrated in FIG. 1c provides for a reduction of the impedance of the differential load line of the differential power amplifier. This allows generation of high PC2 power levels within the inbuilt DC-DC back converter with a much lower 3.4 V supply voltage. Due to the reduction of the impedance of the differential load line of the differential power amplifier 2 by means of the balun transformer circuit as illustrated in the circuit diagram of FIG. 1c it is possible to generate PC2 power levels from a lower 3.4 V supply voltage without using a boosted 5 V supply voltage.

With continuing reference to the embodiment illustrated in FIG. 1c, the transforming capacitor 1C is connected in parallel to the primary coil of the balun transformer circuit 1. The primary coil is connected at the input side of the balun transformer circuit 1 to the differential output of the differential power amplifier 2 integrated in a power amplifier chip package. The primary coil 1A is connected via conductor elements 4A, 4B such as wire bonds or flip-chip bumps to the differential output of the differential power amplifier 2 integrated in a power amplifier chip package.

The secondary coil 1B coupled to the primary coil 1A is connected at the output side of the balun transformer circuit 1 as illustrated in FIG. 1c to an electrical load 3 receiving electrical power from the differential output of the differential power amplifier 2 through the balun transformer circuit 1. The balun transformer circuit 1 has at least one transforming capacitor 1C located at the input side of the balun transformer circuit 1 as illustrated in FIG. 1c and having a capacitance adapted to transform a parasitic inductance of the conductor elements 4A, 4B and a leakage inductance of the balun transformer circuit 1 itself into a differential T-network impedance transformer element as illustrated in FIG. 1d adapted to reduce the impedance of the differential load line.

Figure 2:
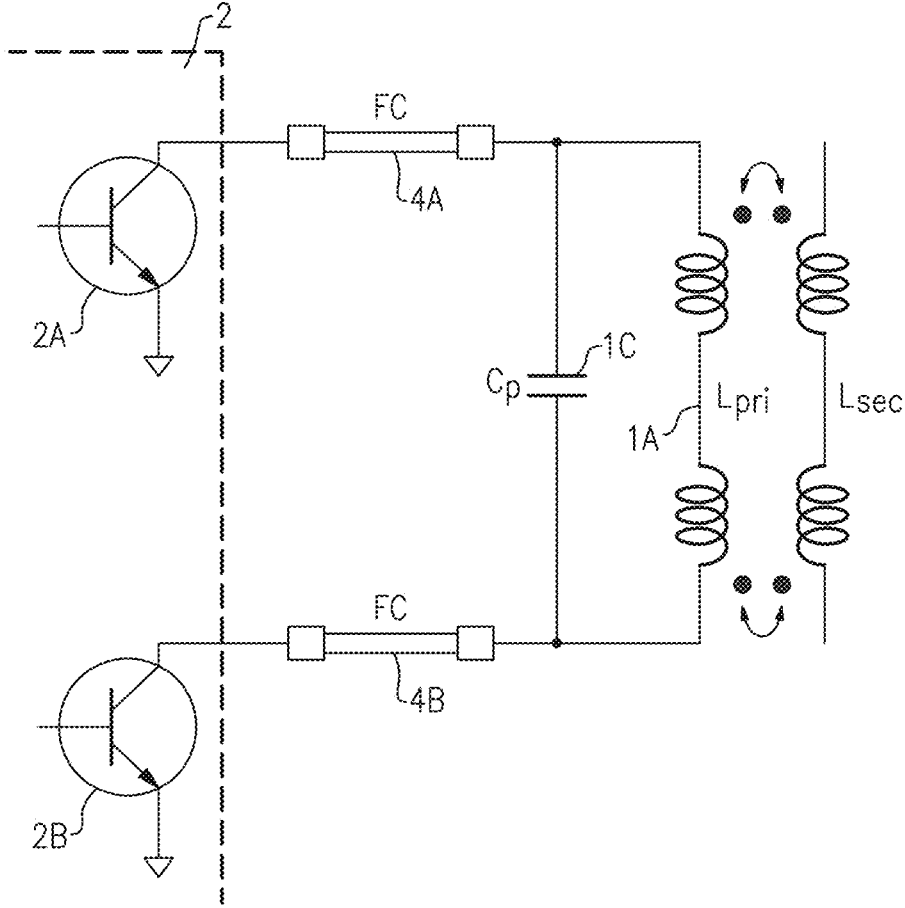
FIG. 2 shows a circuit diagram illustrating a possible exemplary implementation of a balun transformer circuit according to some embodiments of the present disclosure.

FIG. 2 shows a circuit diagram of a primary coil 1A of a balun transformer circuit 1 according to a number of embodiments. In the illustrated implementation of FIG. 2, conductor elements 4A, 4B are formed by flip-chips FCs with a reduced parasitic inductance. The shunt transforming capacitor 1C with a capacitance value of $C_P$ connected in parallel to the primary coil 1A is adapted to mitigate the inductance effect of the leakage inductance and the parasitic inductance of the flip-chips FCs. The transforming capacitor 1C can comprise a shunt RF capacitor connected in parallel to the primary coil 1A of the balun transformer circuit 1 as illustrated in FIG. 2.

In various embodiments, the balun transformer circuit 1 can comprise a laminated balun transformer circuit. This laminated balun transformer circuit may be for instance provided to use an N77 UHB frequency, i.e. in a range between 3.3 GHz and 4.2 GHz. The laminated balun transformer circuit may in some implementations comprise stacked dielectric layers or sheets.

In some embodiments, the transforming capacitor 1C may comprise a surface mounted device (SMD) component. In still further embodiments, the capacitance $C_P$ of the transforming capacitor 1C within the balun transformer circuit 1 can be tunable, for example automatically or manually.

Figure 3:
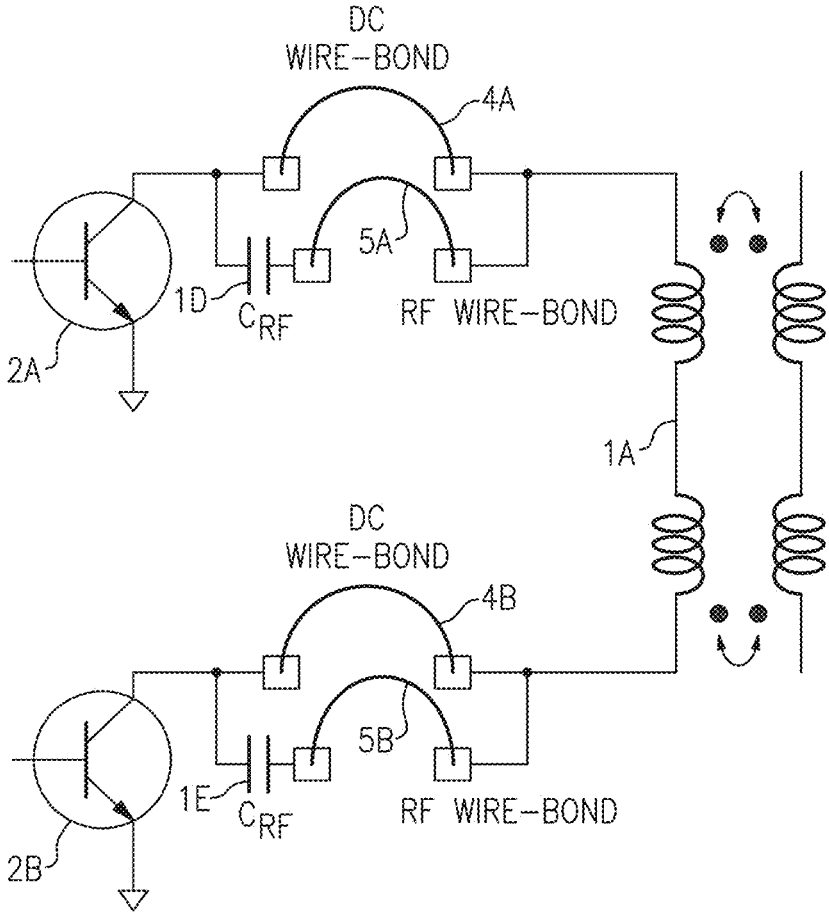
FIG. 3 shows a further circuit diagram illustrating a further exemplary implementation of a balun transformer circuit according to some embodiments of the present disclosure.
Figure 4:
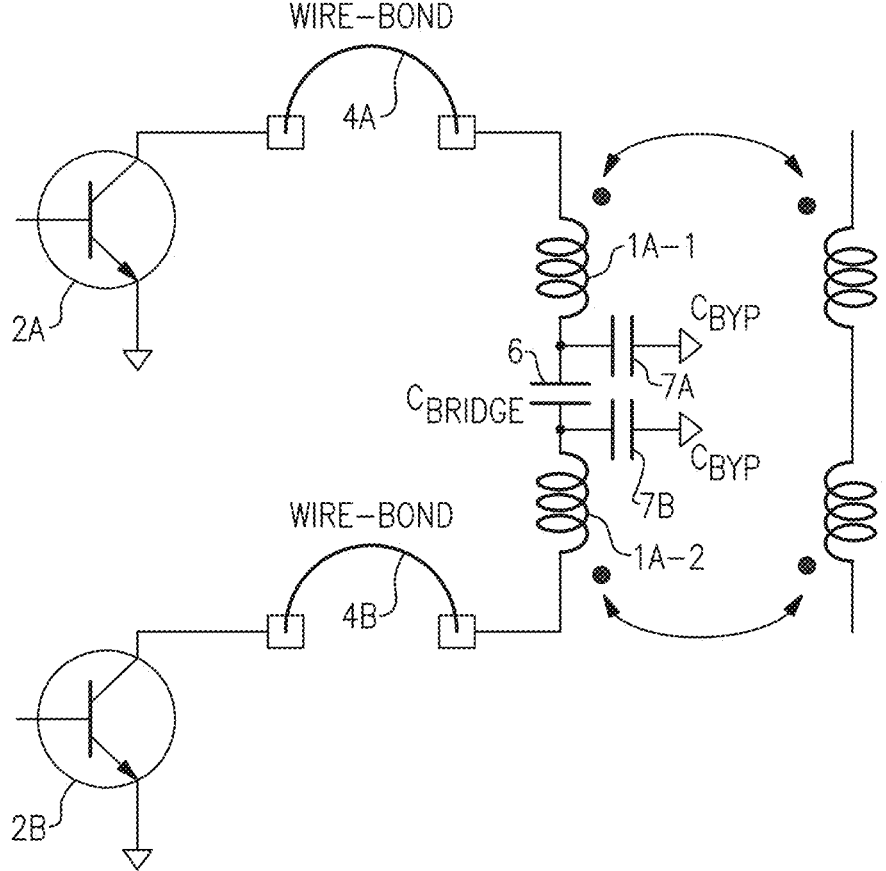
FIG. 4 shows a circuit diagram illustrating a further exemplary implementation of a balun transformer circuit according to some embodiments of the present disclosure.

FIGS. 3 and 4 show further exemplary embodiments of a balun transformer circuit 1 according to the first aspect of the present disclosure. The balun transformer circuit 1 can be connected to the differential output of a differential power amplifier 2. The differential power amplifier 2 can comprise a push-pull power amplifier. FIGS. 3 and 4 illustrate on the left side transistors 2A, 2B at the output stage of the push-pull power amplifier. The transistors 2A, 2B may in some implementations comprise bipolar transistors as illustrated in FIG. 2 or MOSFETs. However, other types of transistors may be used for implementing the transistors 2A, 2B as well.

In the embodiment illustrated in FIG. 3, further RF capacitors 1D, 1E are connected in parallel to both conductor elements 4A, 4B of the differential output of the differential power amplifier 2 to compensate at least partially the leakage inductance of the balun transformer circuit 1. FIG. 3 illustrates a broadband series inductor cancellation by means of the RF capacitors 1D, 1E being connected to associated conductor elements 4A, 4B such as wire bonds. The RF capacitors 1D, 1E may be implemented in a heterojunction bipolar transistor (HBT) die resulting in a larger area of the HBT die. The RF capacitors 1D, 1E may in some implementations be connected via separate RF wire bonds 5A, 5B to both sides of the primary coil 1A of the balun transformer circuit 1 as shown in FIG. 3.

FIG. 4 shows a further embodiment of the balun transformer circuit 1 with an RF bridge capacitor 6 with a capacitance CBRIDGE forming a bridge component between two serially connected primary coil portions 1A-1, 1A-2 of the primary coil 1A of the balun transformer circuit 1. The RF bridge capacitor 6 aids in compensating at least partially the leakage inductance of the balun transformer circuit 1. As shown in FIG. 4, bypass capacitors 7A, 7B each with a capacitance value of $C_{BYP}$ are provided on both sides of the RF bridge capacitor 6. The RF bridge capacitor 6 may be implemented by SMD bypass capacitors. While not illustrated, the balun transformer circuits 1 can include any combination of the transforming capacitor 1C (FIGS. 1c, 1d, 2), the parallel RF capacitors 1D, 1E (FIG. 3), and/or the RF bridge capacitor 6. For example, in some embodiments, the balun transformer circuit includes a transforming capacitor 1C, parallel RF capacitors 1D, 1E, and a bridge capacitor 6.

The embodiments illustrated in FIGS. 2, 3 and 4 may also be combined with each other to provide a reduction of the impedance of a differential load line of a differential power amplifier 2.

Figure 5:
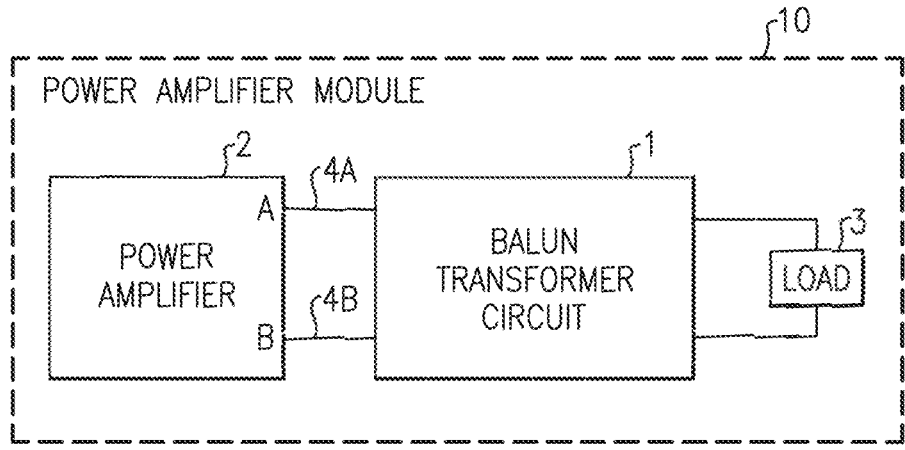
FIG. 5 shows a block diagram illustrating a possible exemplary implementation of a power amplifier module according to some embodiments of the present disclosure.

FIG. 5 shows a block diagram for illustrating a possible exemplary embodiment of a power amplifier module 10 according to a further aspect of the present disclosure. The power amplifier module 10 illustrated in FIG. 5 comprises a differential power amplifier 2 having a differential output connected to a balun transformer circuit 1. The balun transformer circuit 1 is provided for reduction of an impedance of load line of the differential power amplifier 2. The balun transformer circuit illustrated in the block diagram of FIG. 5 may be formed by the balun transformer circuit 1 as illustrated in one of the embodiments of FIGS. 2, 3 and 4.

The balun transformer circuit 1 within the power amplifier module 10 as shown in FIG. 5 comprises a primary coil connected to an input side of the balun transformer circuit 1 to the differential output of the differential power amplifier 2. The power amplifier 2 can be integrated in a power amplifier chip package. For example, power amplifier can be integrated in a packaged integrated circuit that is mounted on a package substrate of the power amplifier module using wire bonds or, alternatively, bump contacts in the case of a flip-chip power amplifier. The package substrate can be a laminated substrate and the power amplifier module 10 can be multi-chip module (MCM). The balun transformer circuit 1 can be a laminated balun transformer circuit having a primary coil 1A is connected via conductor elements 4A, 4B (e.g., flip chip bumps or wire bonds) to the differential power amplifier 2 integrated in the power amplifier chip package. The balun transformer circuit 1 further comprises a secondary coil 1B coupled to the primary coil 1A and connected at an output side of the balun transformer circuit 1 to an electrical load 3 as illustrated in FIG. 5. The electrical load 3 receives electrical power from the differential output of the differential power amplifier 2 through the balun transformer circuit 1.

The balun transformer circuit 1 comprises at least one transforming capacitor 1C as illustrated in the embodiment of FIG. 2 provided at the input side of the balun transformer circuit 1 having a capacitance $C_P$ adapted to transform a parasitic inductance caused by the conductor elements 4A, 4B and a leakage inductance of the balun transformer circuit 1 into a differential T-network impedance transformer element as illustrated in FIG. 1e adapted to reduce the impedance of the load line. The at least one transforming capacitor 1C can be a surface mount device, for example.

The differential power amplifier 2 of the power amplifier module 10 shown in FIG. 5 can comprise a push-pull power amplifier. In a possible implementation, the power amplifier 2 of the power amplifier module 10 comprises a 5G power amplifier providing a power cluster 2 (PC2) power level of electrical power supplied via the balun transformer circuit 1 to the electrical load connected to the output side of the balun transformer circuit 1. The electrical load 3 illustrated in FIG. 5 may in some implementations comprise an antenna. The electrical load 3 is shown as being included on the power amplifier module 10 for the purposes of illustration. However, the antenna or other electrical load 3 can be external and electrically coupled to the power amplifier module, such as on a phone board or other location on a mobile phone on which the power amplifier module resides.

In various embodiments, the power amplifier module 10 illustrated in FIG. 5 may support high PC2 power levels according to 3GPP specifications for an enhanced range of operation when transmitting 5G-NR transmission frequencies in a frequency band between 2.3 GHz to 5 GHz. The PC2 power levels at the power amplifier module output can range in a possible embodiment from 28.5 dbm to 30 dbm, depending on the use cases.

The power amplifier module 10 illustrated in FIG. 5 can enable generation of the acceptably high PC power levels using only the inbuilt DC-DC back converter of the power amplifier 2, e.g., without including a boost DC-DC converter. This enables the power amplifier module 10 as shown in FIG. 5 to generate similar PC power levels from a comparatively low voltage of e.g. 3.4 V. This is achieved by the impedance reduction of the differential load line to the electrical load 3 by means for the balun transformer circuit 1.

By adding a single transforming capacitor 1A, the parasitic balun leakage inductance and the parasitic inductance of the conductor elements 4A, 4B are transformed into useful elements of a T-network impedance transformer as illustrated in FIG. 1e. The added transforming capacitor 1A can be formed by a SMD component of a laminate MCM and as such may easily be tuned during said evaluation to finetune the appropriate capacitor values without any change to the HBT power amplifier or the laminate printed inductors.

The balun transformer circuit 1 can be used for reduction of an impedance of a differential load line for differential power amplifier 2 of an electronic device. This electronic device can comprise a portable electronic device such as a mobile phone. The balun transformer circuit 1 of the power amplifier module 10 as illustrated in FIG. 5 advantageously supports miniaturization without requiring the provision of a boost DC-DC converter to boost supply voltage received from a voltage source such as a standard battery.

The International Telecommunication Union (ITU) is a specialized agency of the United Nations (UN) responsible for global issues concerning information and communication technologies, including the shared global use of radio spectrum.

The 3rd Generation Partnership Project (3GPP) is a collaboration between groups of telecommunications standard bodies across the world, such as the Association of Radio Industries and Businesses (ARIB), the Telecommunications Technology Committee (TTC), the China Communications Standards Association (CCSA), the Alliance for Telecommunications Industry Solutions (ATIS), the Telecommunications Technology Association (TTA), the European Telecommunications Standards Institute (ETSI), and the Telecommunications Standards Development Society, India (TSDSI).

Working within the scope of the ITU, 3GPP develops and maintains technical specifications for a variety of mobile communication technologies, including, for example, second generation (2G) technology (for instance, Global System for Mobile Communications (GSM) and Enhanced Data Rates for GSM Evolution (EDGE)), third generation (3G) technology (for instance, Universal Mobile Telecommunications System (UMTS) and High Speed Packet Access (HSPA)), and fourth generation (4G) technology (for instance, Long Term Evolution (LTE) and LTE-Advanced).

The technical specifications controlled by 3GPP can be expanded and revised by specification releases, which can span multiple years and specify a breadth of new features and evolutions.

In one example, 3GPP introduced carrier aggregation (CA) for LTE in Release 10. Although initially introduced with two downlink carriers, 3GPP expanded carrier aggregation in Release 14 to include up to five downlink carriers and up to three uplink carriers. Other examples of new features and evolutions provided by 3GPP releases include, but are not limited to, License Assisted Access (LAA), enhanced LAA (eLAA), Narrowband Internet of things (NB-IOT), Vehicle-to-Everything (V2X), and High Power User Equipment (HPUE).

3GPP introduced Phase 1 of fifth generation (5G) technology in Release and introduced Phase 2 of 5G technology in Release 16. Subsequent 3GPP releases will further evolve and expand 5G technology. 5G technology is also referred to herein as New Radio (NR).

5G NR supports or plans to support a variety of features, such as communications over millimeter wave spectrum, beamforming capability, high spectral efficiency waveforms, low latency communications, multiple radio numerology, and/or non-orthogonal multiple access (NOMA). Although such RF functionalities offer flexibility to networks and enhance user data rates, supporting such features can pose a number of technical challenges.

The teachings herein are applicable to a wide variety of communication systems, including, but not limited to, communication systems using advanced cellular technologies, such as LTE-Advanced, LTE-Advanced Pro, and/or 5G NR.

Figure 6:
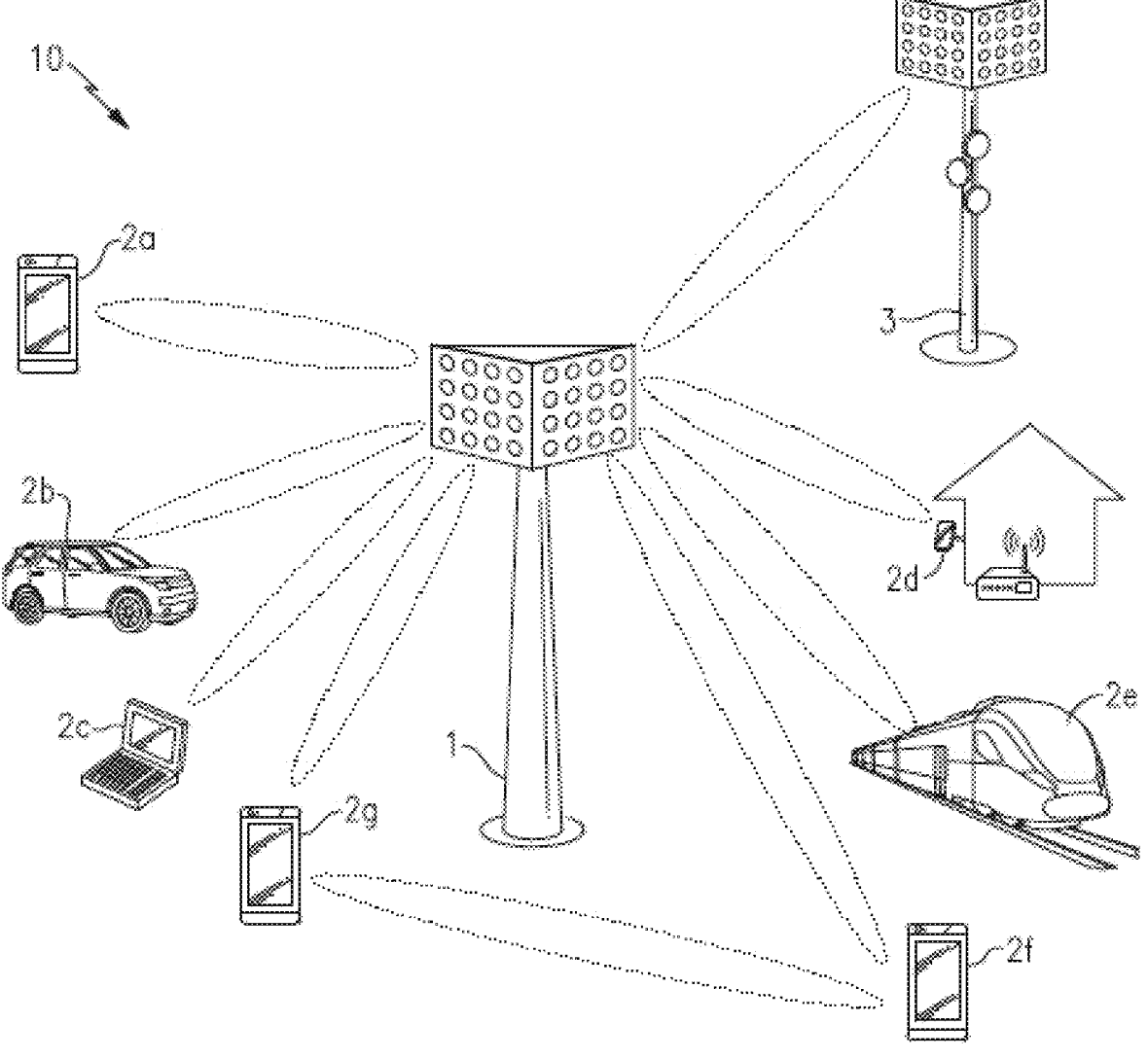
FIG. 6 is a schematic diagram of one example of a communication network.

FIG. 6 is a schematic diagram of one example of a communication network 10. The communication network 10 includes a macro cell base station 1, a small cell base station 3, and various examples of user equipment (UE), including a first mobile device 2a, a wireless-connected car 2b, a laptop 2c, a stationary wireless device 2d, a wireless-connected train 2e, a second mobile device 2f, and a third mobile device 2g.

Although specific examples of base stations and user equipment are illustrated in FIG. 6, a communication network can include base stations and user equipment of a wide variety of types and/or numbers.

For instance, in the example shown, the communication network 10 includes the macro cell base station 1 and the small cell base station 3. The small cell base station 3 can operate with relatively lower power, shorter range, and/or with fewer concurrent users relative to the macro cell base station 1. The small cell base station 3 can also be referred to as a femtocell, a picocell, or a microcell. Although the communication network 10 is illustrated as including two base stations, the communication network 10 can be implemented to include more or fewer base stations and/or base stations of other types.

Although various examples of user equipment are shown, the teachings herein are applicable to a wide variety of user equipment, including, but not limited to, mobile phones, tablets, laptops, IoT devices, wearable electronics, customer premises equipment (CPE), wireless-connected vehicles, wireless relays, and/or a wide variety of other communication devices. Furthermore, user equipment includes not only currently available communication devices that operate in a cellular network, but also subsequently developed communication devices that will be readily implementable with the inventive systems, processes, methods, and devices as described and claimed herein. For example, any of the balun transformer circuits and power amplifiers and power amplifier modules described herein (e.g., the balun transformer circuits of FIGS. 1[a]-1[e] or of FIGS. 2-5, the power amplifier 2 or power amplifier module 10 of FIG. 5) can be included in such user equipment (e.g., in any of the user equipment 2a-2g shown in FIG. 6) or included in a base station (e.g., the cell base station 1 or small cell base station 3 of FIG. 6).

The illustrated communication network 10 of FIG. 6 supports communications using a variety of cellular technologies, including, for example, 4G LTE and 5G NR. In certain implementations, the communication network 10 is further adapted to provide a wireless local area network (WLAN), such as WiFi. Although various examples of communication technologies have been provided, the communication network 10 can be adapted to support a wide variety of communication technologies.

Various communication links of the communication network 10 have been depicted in FIG. 6. The communication links can be duplexed in a wide variety of ways, including, for example, using frequency-division duplexing (FDD) and/or time-division duplexing (TDD). FDD is a type of radio frequency communications that uses different frequencies for transmitting and receiving signals. FDD can provide a number of advantages, such as high data rates and low latency. In contrast, TDD is a type of radio frequency communications that uses about the same frequency for transmitting and receiving signals, and in which transmit and receive communications are switched in time. TDD can provide a number of advantages, such as efficient use of spectrum and variable allocation of throughput between transmit and receive directions.

In certain implementations, user equipment can communicate with a base station using one or more of 4G LTE, 5G NR, and WiFi technologies. In certain implementations, enhanced license assisted access (eLAA) is used to aggregate one or more licensed frequency carriers (for instance, licensed 4G LTE and/or 5G NR frequencies), with one or more unlicensed carriers (for instance, unlicensed WiFi frequencies).

As shown in FIG. 6, the communication links include not only communication links between UE and base stations, but also UE to UE communications and base station to base station communications. For example, the communication network 10 can be implemented to support self-fronthaul and/or self-backhaul (for instance, as between mobile device 2g and mobile device 2f).

The communication links can operate over a wide variety of frequencies. In certain implementations, communications are supported using 5G NR technology over one or more frequency bands that are less than 6 Gigahertz (GHz) and/or over one or more frequency bands that are greater than 6 GHz. For example, the communication links can serve Frequency Range 1 (FR1), Frequency Range 2 (FR2), or a combination thereof. In one embodiment, one or more of the mobile devices support a HPUE power class specification.

In certain implementations, a base station and/or user equipment communicates using beamforming. For example, beamforming can be used to focus signal strength to overcome path losses, such as high loss associated with communicating over high signal frequencies. In certain embodiments, user equipment, such as one or more mobile phones, communicate using beamforming on millimeter wave frequency bands in the range of 30 GHz to 300 GHz and/or upper centimeter wave frequencies in the range of 6 GHz to 30 GHz, or more particularly, 24 GHz to 30 GHz. Cellular user equipment can communicate using beamforming and/or other techniques over a wide range of frequencies, including, for example, FR2-1 (24 GHz to 52 GHz), FR2-2 (52 GHz to 71 GHz), and/or FR1 (400 MHz to 7125 MHz).

Different users of the communication network 10 can share available network resources, such as available frequency spectrum, in a wide variety of ways.

In one example, frequency division multiple access (FDMA) is used to divide a frequency band into multiple frequency carriers. Additionally, one or more carriers are allocated to a particular user. Examples of FDMA include, but are not limited to, single carrier FDMA (SC-FDMA) and orthogonal FDMA (OFDMA). OFDMA is a multicarrier technology that subdivides the available bandwidth into multiple mutually orthogonal narrowband subcarriers, which can be separately assigned to different users.

Other examples of shared access include, but are not limited to, time division multiple access (TDMA) in which a user is allocated particular time slots for using a frequency resource, code division multiple access (CDMA) in which a frequency resource is shared amongst different users by assigning each user a unique code, space-divisional multiple access (SDMA) in which beamforming is used to provide shared access by spatial division, and non-orthogonal multiple access (NOMA) in which the power domain is used for multiple access. For example, NOMA can be used to serve multiple users at the same frequency, time, and/or code, but with different power levels.

Enhanced mobile broadband (eMBB) refers to technology for growing system capacity of LTE networks. For example, eMBB can refer to communications with a peak data rate of at least 10 Gbps and a minimum of 100 Mbps for each user. Ultra-reliable low latency communications (uRLLC) refers to technology for communication with very low latency, for instance, less than 2 milliseconds. uRLLC can be used for mission-critical communications such as for autonomous driving and/or remote surgery applications. Massive machine-type communications (mMTC) refers to low cost and low data rate communications associated with wireless connections to everyday objects, such as those associated with Internet of Things (I) applications.

The communication network 10 of FIG. 6 can be used to support a wide variety of advanced communication features, including, but not limited to, eMBB, uRLLC, and/or mMTC.

In certain implementations, the communication network 10 supports supplementary uplink (SUL) and/or supplementary downlink (SDL). For example, when channel conditions are good, the communication network 10 can direct a particular UE to transmit using an original uplink frequency, while when channel condition is poor (for instance, below a certain criteria) the communication network 10 can direct the UE to transmit using a supplementary uplink frequency that is lower than the original uplink frequency. Since cell coverage increases with lower frequency, communication range and/or signal-to-noise ratio (SNR) can be increased using SUL. Likewise, SDL can be used to transmit using an original downlink frequency when channel conditions are good, and to transmit using a supplementary downlink frequency when channel conditions are poor.

Figure 7:
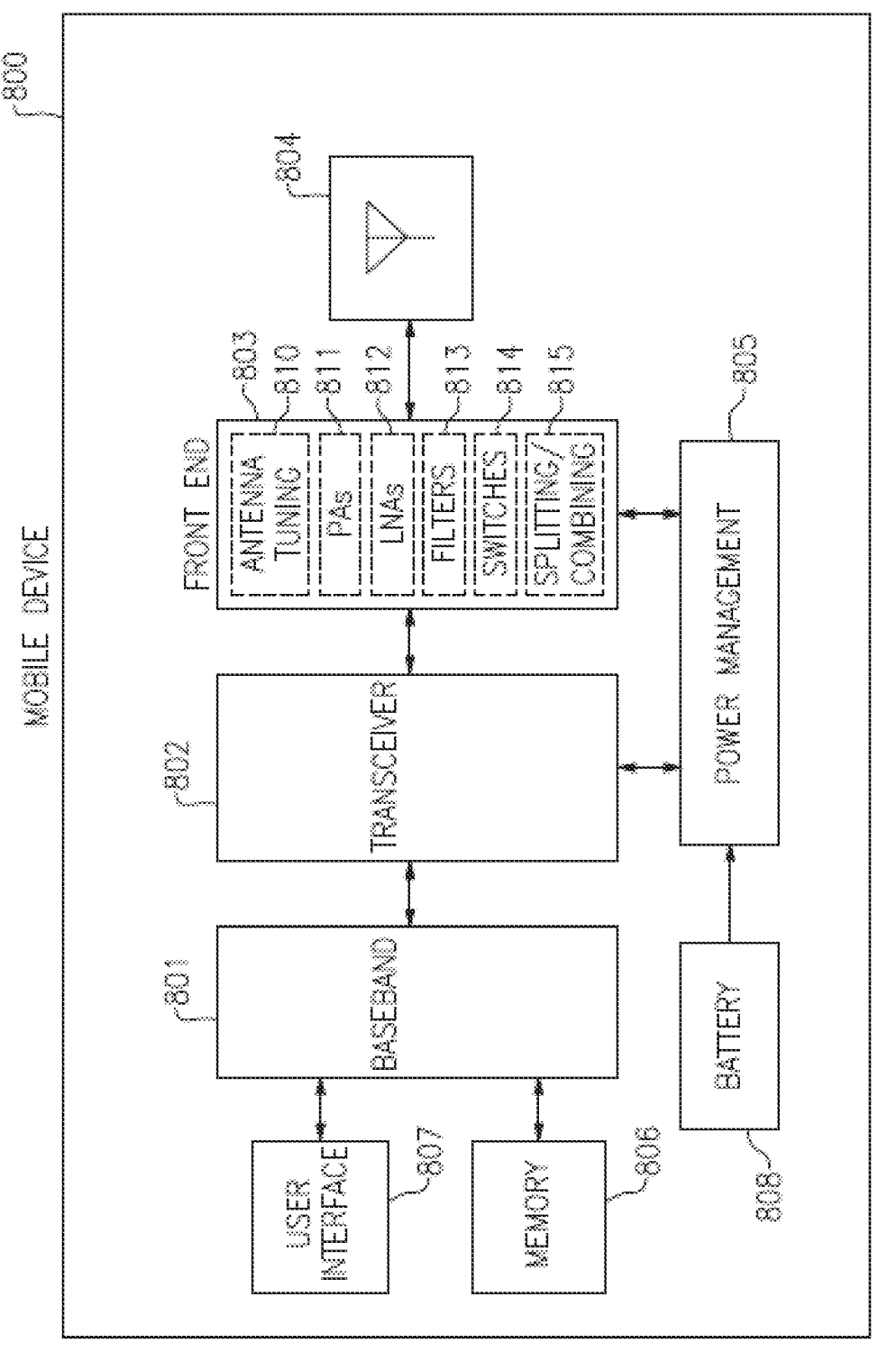
FIG. 7 is a schematic diagram of one embodiment of a mobile device.

FIG. 7 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 7 as the transceiver 802. In one example, separate components (for instance, separate circuits or dies) can be provided for handling certain types of RF signals.

The front end system 803 aids in conditioning signals transmitted to and/or received from the antennas 804. In the illustrated embodiment, the front end system 803 includes antenna tuning circuitry 810, power amplifiers (PAs) 811, low noise amplifiers (LNAs) 812, filters 813, switches 814, and signal splitting/combining circuitry 815. However, other implementations are possible.

Any of the balun transformer circuits and power amplifiers and power amplifier modules described herein (e.g., the balun transformer circuits of FIGS. 1[a]-1[e] or of FIGS. 2-5, the power amplifier 2 or power amplifier module 10 of FIG. 5) can be included in the mobile device 800 of FIG. 7. For example, the power amplifiers 811 of the mobile device 800 can include one or more of the power amplifiers 2 and/or power amplifier modules 10 of FIG. 5.

For example, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 7, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 7, the power management system 805 receives a battery voltage from the battery 808. The battery

808 can be any suitable battery for use in the mobile device 800, including, for example, a lithium-ion battery.

While various embodiments of the application have been described, it will be apparent to a person of ordinary skills in the art that many embodiments and implementations are possible. Accordingly, the inventions are not to be restricted except in light of the attached claims and the equivalents.

What is claimed is:

1. A power amplifier module comprising:
   a differential power amplifier having a differential output; and
   a balun transformer circuit connected to the differential output of the differential power amplifier, the balun transformer circuit having a primary coil connected at an input side of the balun transformer circuit to each branch of the differential output of the differential power amplifier via a corresponding conductor element of a plurality of conductor elements that include wire bonds or flip-chip bumps, a secondary coil coupled to the primary coil and connected at an output side of the balun transformer circuit, and at least one capacitor adapted to reduce an impedance of a differential load line of the differential power amplifier, the at least one capacitor transforming a parasitic inductance of the plurality of conductor elements and a leakage inductance of the balun transformer circuit into a differential T-network impedance transformer element.

2. The power amplifier module of claim 1 wherein the at least one capacitor includes a shunt radio frequency capacitor in parallel to the primary coil of the balun transformer circuit.

3. The power amplifier module of claim 1 wherein the balun transformer circuit includes a laminated balun transformer circuit.

4. The power amplifier module of claim 1 wherein the differential power amplifier is a 5G power amplifier providing a Power Cluster 2 power level of electrical power supplied via the balun transformer circuit to an electrical load connected to the output side of the balun transformer circuit.

5. A power amplifier module comprising:
   a differential power amplifier having a differential output; and
   a balun transformer circuit connected to the differential output of the differential power amplifier, the balun transformer circuit having a primary coil connected at an input side of the balun transformer circuit to the differential output of the differential power amplifier, a secondary coil coupled to the primary coil and connected at an output side of the balun transformer circuit, and at least one capacitor adapted to reduce an impedance of a differential load line of the differential power amplifier, the at least one capacitor including a capacitor connected in parallel to each branch of the differential output of the differential power amplifier to compensate at least partially for a leakage inductance of the balun transformer circuit.

6. The power amplifier module of claim 5 wherein the primary coil is connected at the input side of the balun transformer circuit to each branch of the differential output of the differential power amplifier via a corresponding conductor element of a plurality of conductor elements.

7. The power amplifier module of claim 6 wherein the plurality of conductor elements include wire bonds or flip-chip bumps.

8. The power amplifier module of claim 5 wherein the differential power amplifier is a 5G power amplifier providing a Power Cluster 2 power level of electrical power supplied via the balun transformer circuit to an electrical load connected to the output side of the balun transformer circuit.

9. A power amplifier module comprising:

a differential power amplifier having a differential output; and a balun transformer circuit connected to the differential output of the differential power amplifier, the balun transformer circuit having a primary coil connected at an input side of the balun transformer circuit to the differential output of the differential power amplifier, a secondary coil coupled to the primary coil and connected at an output side of the balun transformer circuit, and at least one capacitor adapted to reduce an impedance of a differential load line of the differential power amplifier, the at least one capacitor including a bridge capacitor between two serially connected primary coil portions of the primary coil of the balun transformer circuit to compensate at least partially for a leakage inductance of the balun transformer circuit.

10. The power amplifier module of claim 9 wherein the at least one capacitor further include bypass capacitors coupled to two sides of the bridge capacitor.

11. The power amplifier module of claim 9 wherein the differential power amplifier is a 5G power amplifier providing a Power Cluster 2 power level of electrical power supplied via the balun transformer circuit to an electrical load connected to the output side of the balun transformer circuit.

12. A balun transformer circuit comprising:

a primary coil at an input side of the balun transformer circuit and configured for connection to a differential output of a differential power amplifier integrated in a power amplifier chip package, the primary coil connected at the input side of the balun transformer circuit to each branch of the differential output of the differential power amplifier via a corresponding conductor element of a plurality of conductor elements, the plurality of conductor elements including wire bonds or flip-chip bumps;

a secondary coil coupled to the primary coil at an output side of the balun transformer circuit and configured for connection to an electrical load receiving electrical power from the differential output of the differential power amplifier through the balun transformer circuit; and at least one capacitor adapted to reduce an impedance of a differential load line of the differential power amplifier, the at least one capacitor transforming a parasitic inductance of the plurality of conductor elements and a leakage inductance of the balun transformer circuit into a differential T-network impedance transformer element.

13. The balun transformer circuit of claim 12 wherein the at least one capacitor includes a shunt radio frequency capacitor in parallel to the primary coil of the balun transformer circuit.

14. The balun transformer circuit of claim 12 wherein the balun transformer circuit is a laminated balun transformer circuit.

15. A power amplifier module comprising:

a differential power amplifier having a differential output; and a balun transformer circuit connected to the differential output of the differential power amplifier, the balun transformer circuit having a primary coil connected at an input side of the balun transformer circuit to the differential output of the differential power amplifier, a secondary coil coupled to the primary coil and connected at an output side of the balun transformer circuit, and at least one capacitor adapted to reduce an impedance of a differential load line of the differential power amplifier, the differential power amplifier including a in-built low voltage DC-DC buck converter.

16. The power amplifier module of claim 15 wherein the differential power amplifier is a 5G power amplifier providing a Power Cluster 2 power level of electrical power supplied via the balun transformer circuit to an electrical load connected to the output side of the balun transformer circuit.

17. A balun transformer circuit comprising:

a primary coil at an input side of the balun transformer circuit and configured for connection to a differential output of a differential power amplifier integrated in a power amplifier chip package;

a secondary coil coupled to the primary coil at an output side of the balun transformer circuit and configured for connection to an electrical load receiving electrical power from the differential output of the differential power amplifier through the balun transformer circuit; and at least one capacitor adapted to reduce an impedance of a differential load line of the differential power amplifier, the at least one capacitor including a capacitor connected in parallel to each branch of the differential output of the differential power amplifier to compensate at least partially for a leakage inductance of the balun transformer circuit.

18. The balun transformer circuit of claim 17 wherein the primary coil is connected at the input side of the balun transformer circuit to each branch of the differential output of the differential power amplifier via a corresponding conductor element of a plurality of conductor elements.

19. The balun transformer circuit of claim 18 wherein the plurality of conductor elements include wire bonds or flip-chip bumps.

20. The balun transformer circuit of claim 17 wherein the balun transformer circuit is a laminated balun transformer circuit.

* * * * *